(12) United States Patent
Kawakubo et al.

(10) Patent No.: US 7,436,103 B2
(45) Date of Patent: Oct. 14, 2008

(54) VARIABLE INDUCTOR ELEMENT AND MOBILE WIRELESS APPARATUS

(75) Inventors: Takashi Kawakubo, Yokohama (JP);
Toshihiko Nagano, Kawasaki (JP);
Michihiko Nishigaki, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 106 days.

(21) Appl. No.: 11/646,624

(22) Filed: Dec. 28, 2006

(65) Prior Publication Data
US 2007/0182520 A1    Aug. 9, 2007

(30) Foreign Application Priority Data
Dec. 28, 2005  (JP) .............................. 2005-378401

(51) Int. Cl.
*H02N 2/00* (2006.01)
*H01L 41/08* (2006.01)
(52) U.S. Cl. .................................. 310/333; 310/323.17
(58) Field of Classification Search ............ 310/323.17, 310/333
See application file for complete search history.

(56) References Cited

U.S. PATENT DOCUMENTS

| 5,861,549 | A | * | 1/1999 | Neukermans et al. | ........ 310/333 |
| 5,969,465 | A | * | 10/1999 | Neukermans et al. | ........ 310/333 |
| 7,019,885 | B2 | * | 3/2006 | Michalicek | ................. 359/290 |

FOREIGN PATENT DOCUMENTS

| JP | 2000-213586 | 7/2000 |
| JP | 2002-007788 | 1/2002 |
| JP | 2003-385623 | 11/2003 |

* cited by examiner

*Primary Examiner*—Thomas M Dougherty
(74) *Attorney, Agent, or Firm*—Ohlandt, Greeley, Ruggiero & Perle, L.L.P.

(57) ABSTRACT

A variable inductor element has a substrate, a first inductor element which is fixedly arranged on the substrate, a second inductor element which is supported by the substrate, is magnetically coupled with the first inductor element and variably control a mutual conductance with the first inductor element, and at least one piezoelectric actuator pair which torsionally drives the second inductor element.

18 Claims, 13 Drawing Sheets

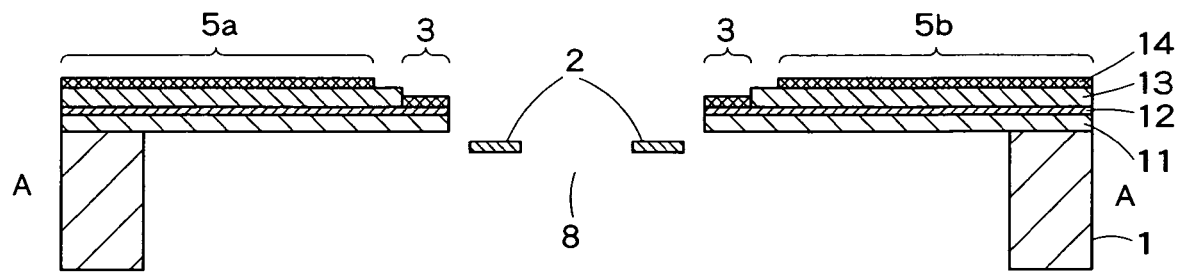
F I G. 3
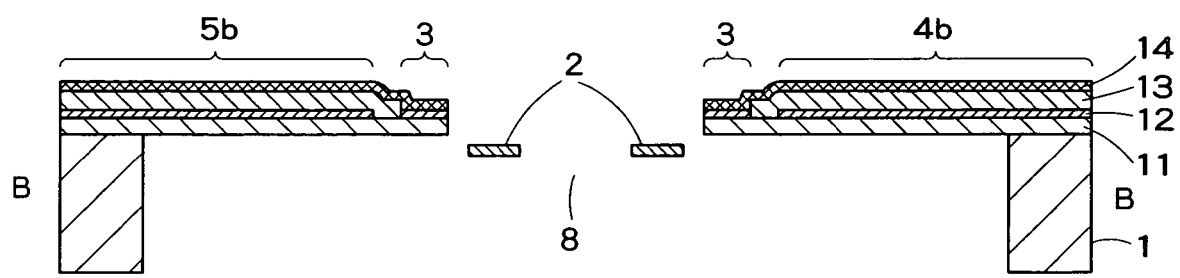
F I G. 4

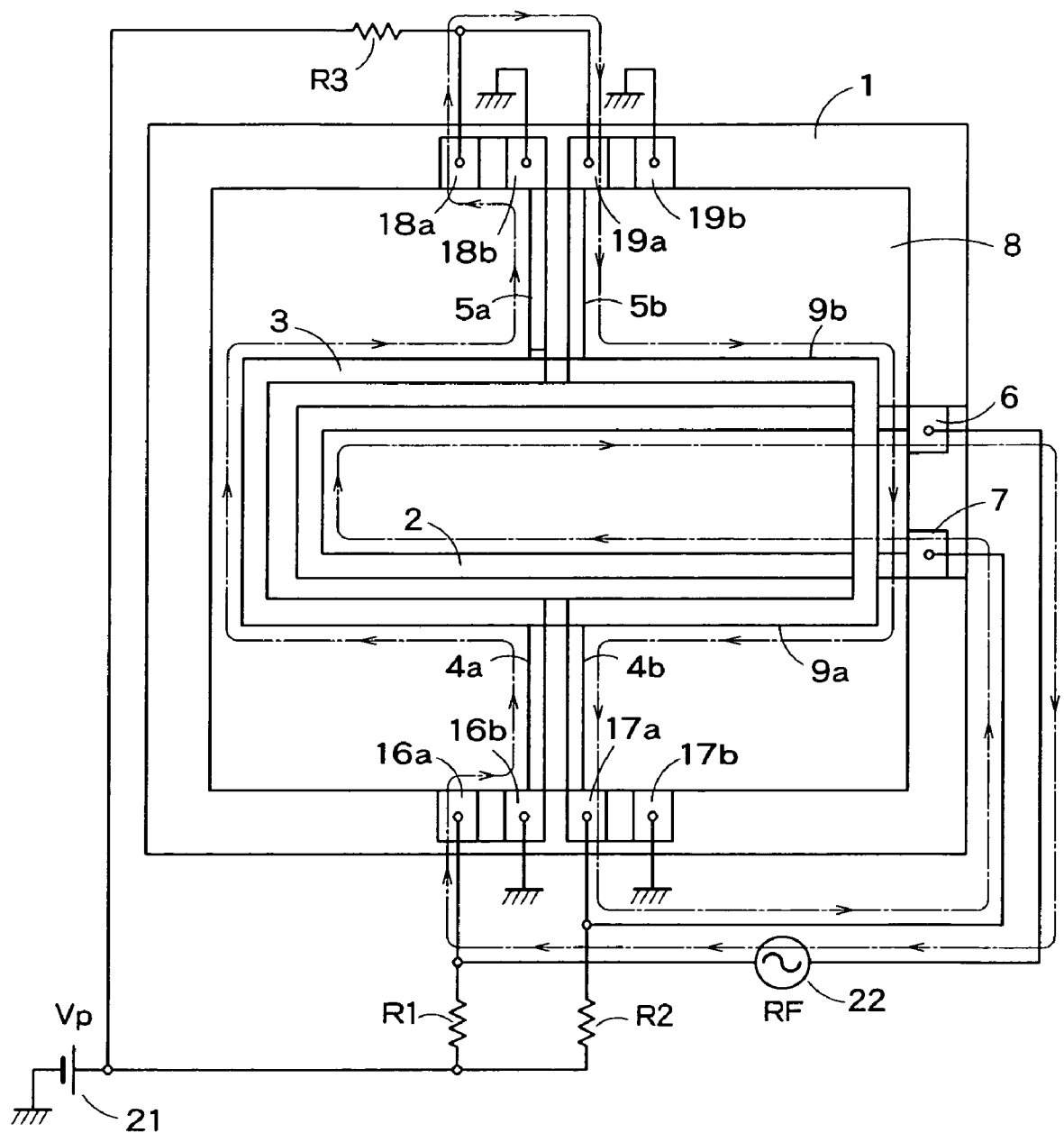
F I G. 7

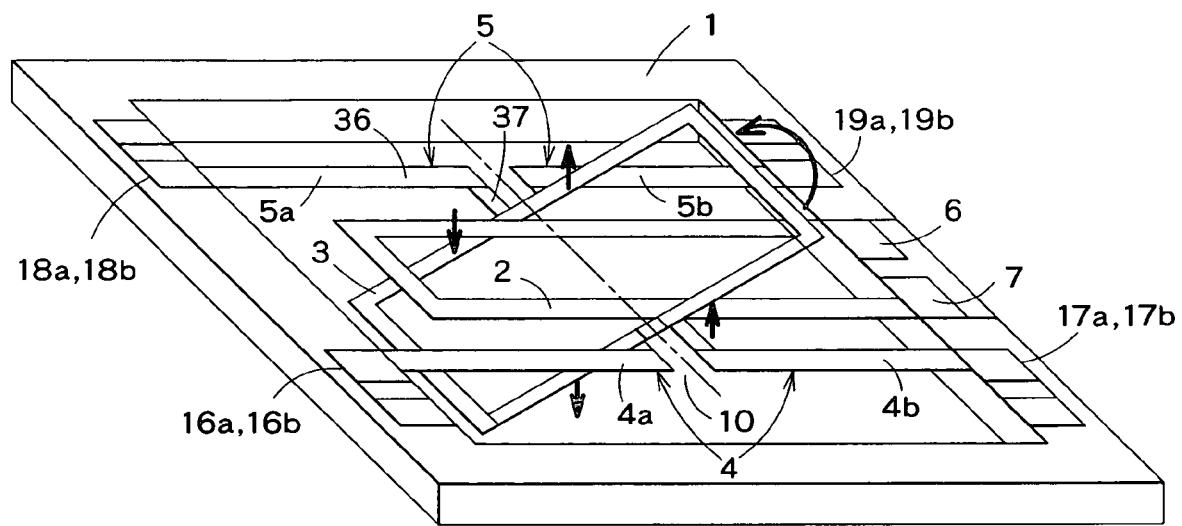
F I G. 13
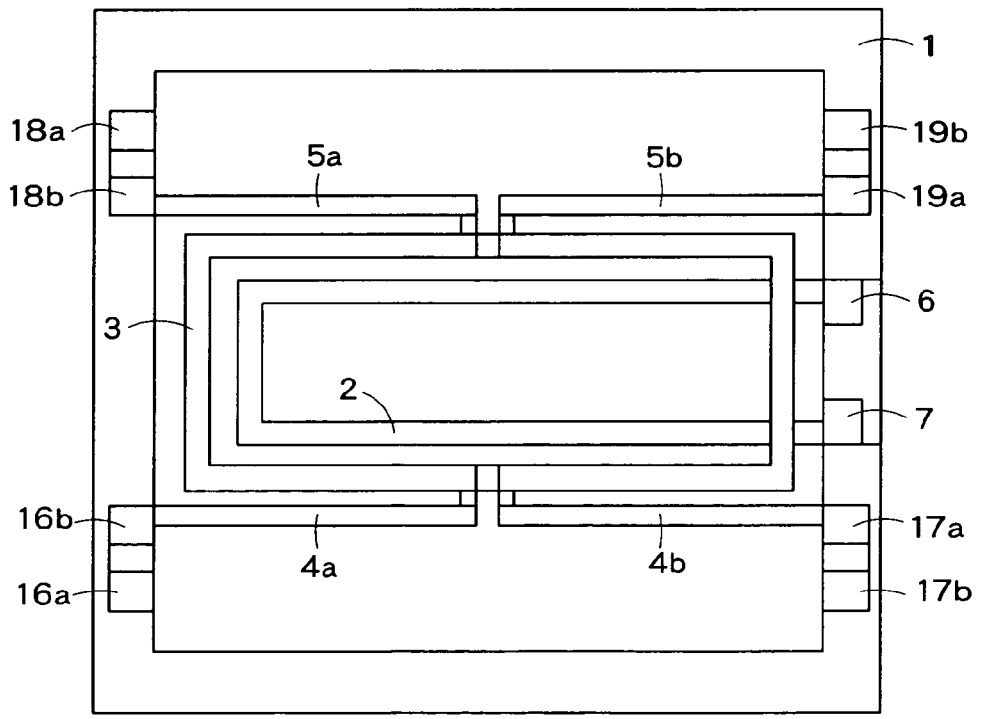
F I G. 14

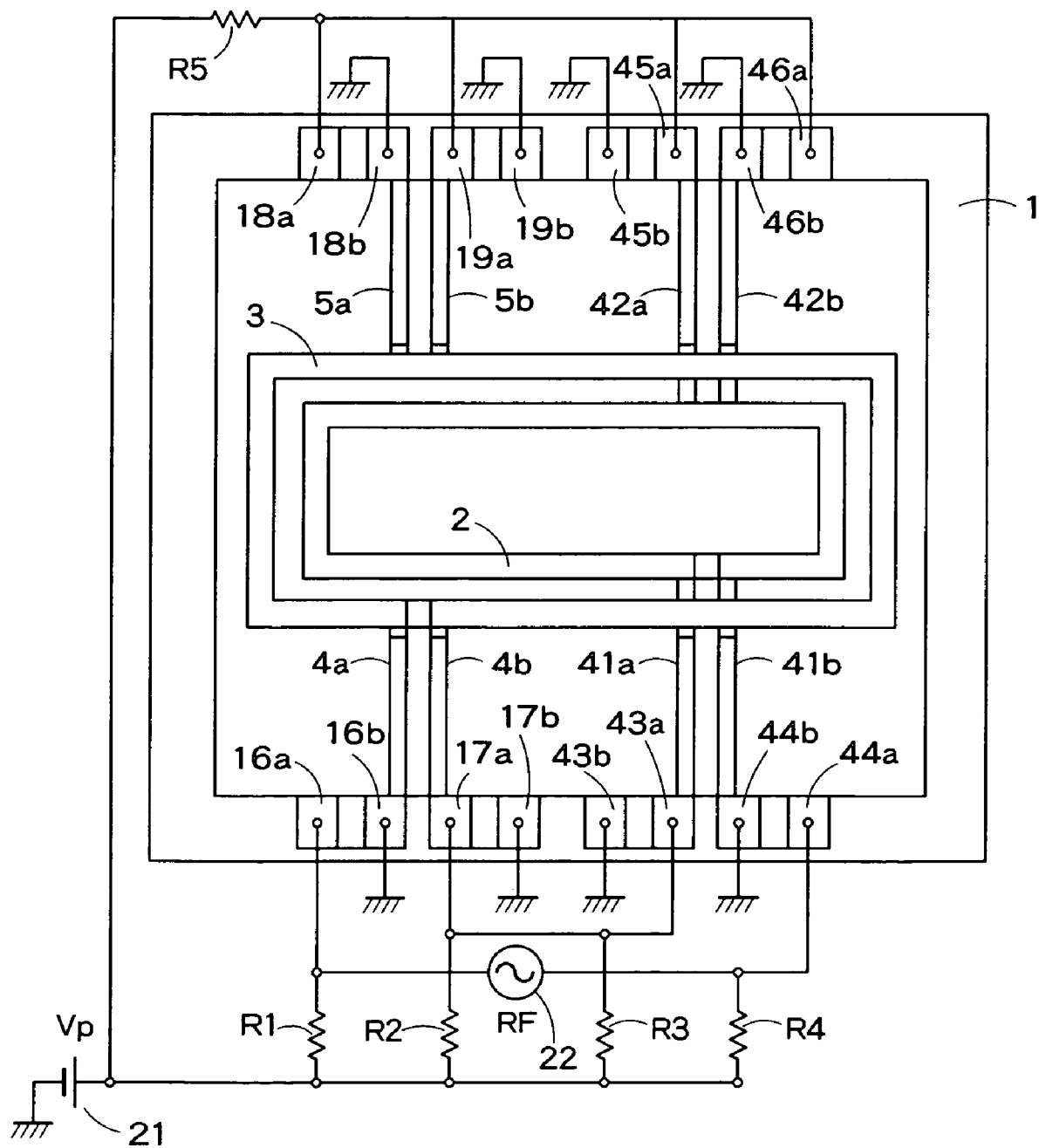
F I G. 19

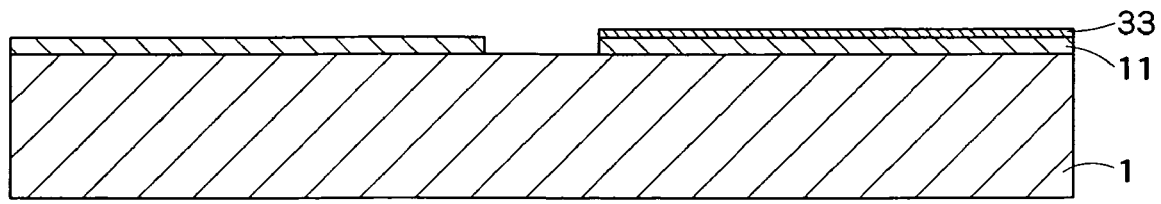
F I G. 20A
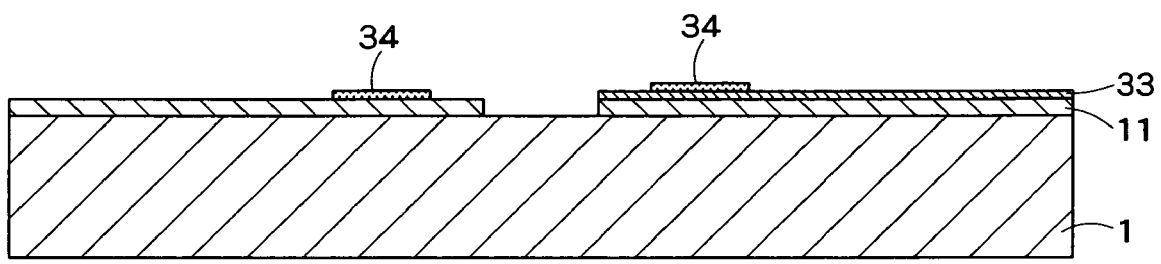
F I G. 20B
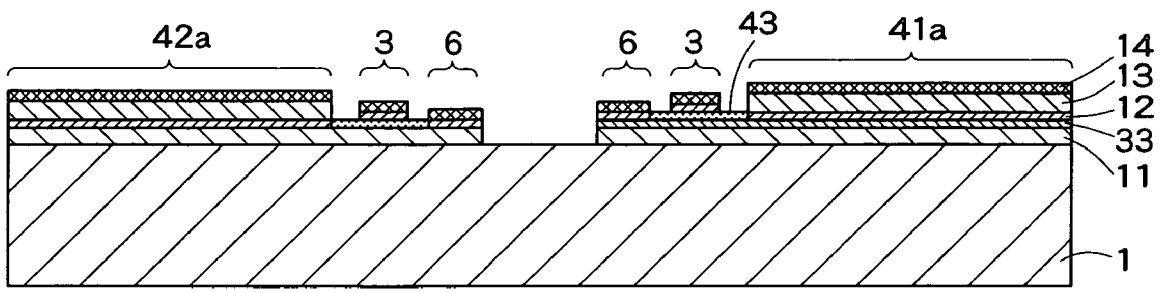
F I G. 20C
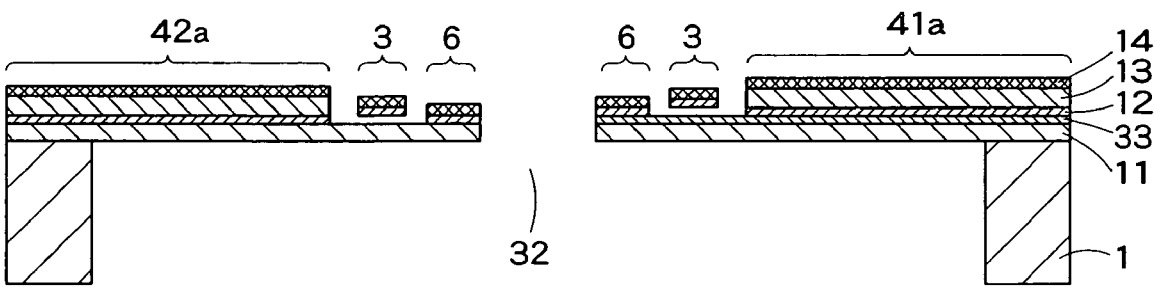
F I G. 20D

VARIABLE INDUCTOR ELEMENT AND MOBILE WIRELESS APPARATUS

CROSS REFERENCE TO RELATED APPLICATIONS

This application is based upon and claims the benefit of priority from the prior Japanese Patent Application No. 2005-378401, filed on Dec. 28, 2005, the entire contents of which are incorporated herein by reference.

BACKGROUND OF THE INVENTION

1. Field of the Invention

The present invention relates to a variable inductor element having a piezoelectric actuator and a mobile wireless apparatus.

2. Related Art

There are known techniques for driving a mirror or lens using a temperature, electrostatic force, electromechanical impulse, and magnetic force (see JP-A 2003-209981 (Kokai)).

A piezoelectric actuator having a piezoelectric element manufactured using MEMS (Micro Electro Mechanical System) technology has recently been attracting attention. A piezoelectric element manufactured by MEMS technology is characterized by its small size and large driving force. There have been proposed variable inductors using piezoelectric actuators of this type (see JP-A 2004-304154 (Kokai) and JP-A 2001-76935 (Kokai)). In a piezoelectric actuator disclosed in JP-A 2004-304154 (Kokai), a dielectric sheet on which a spiral inductor is formed is arranged on a substrate on which the other spiral inductor is formed. By moving the dielectric sheet on the substrate, the degree of overlap between the two spiral inductors is varied to change the inductance. The dielectric sheet is moved by electrostatic driving force generated from a linear actuator. Because the whole dielectric sheet is moved, a large amount of driving force is necessary. Therefore, there is a problem in which it is difficult to quickly move the dielectric sheet and power consumption is also large.

In a variable inductor disclosed in JP-A 2001-76935 (Kokai), two loop inductors whose magnetic fluxes overlap with each other are prepared, and the magnitude of magnetic coupling between the two inductors is variably controlled by changing the angle of one of the inductors. However, since the inductor, whose angle is varied, is arranged on a substrate, the angle cannot be set to below the surface of the substrate, and an angle range within which the inductor can move is limited. JP-A 2001-76935 (Kokai) also discloses several methods for varying an angle. Any of the methods cannot drive an inductor with a small driving force and suffers from problems of higher power consumption, a lower driving speed, and the like.

SUMMARY OF THE INVENTION

The present invention provides a variable inductor element which can variably control an inductance quickly with a small driving force and has a wide variable range of inductance and a method of manufacturing the same and a mobile wireless apparatus.

According to one embodiment of the present invention, a variable inductor element, comprising:

a substrate;

a first inductor element which is fixedly arranged on the substrate;

a second inductor element which is supported by the substrate, is magnetically coupled with the first inductor element and variably control a mutual conductance with the first inductor element; and at least one piezoelectric actuator pair which torsionally drives the second inductor element.

According to one embodiment of the present invention, a variable inductor element, comprising:

a substrate on which a concave portion is formed;

a first inductor element which is fixed on the substrate and is arranged in or above the concave portion;

a second inductor element, at least a portion of the second inductor element being arranged in and above the concave portion, the second inductor element being magnetically coupled with the first inductor element, and variably controlling an angle with respect to a horizontal surface of the substrate to variably control a mutual inductance with the first inductance element; and at least one piezoelectric actuator pair which torsionally drives the second inductor element.

According to one embodiment of the present invention, a variable inductor element, comprising:

a substrate on which a concave portion is formed;

a first inductor element, at least a portion of the first inductor element being capable of being arranged in and above the concave portion, the first inductor element variably changing an angle with respect to a horizontal surface of the substrate;

a second inductor element, at least a portion of the second inductor element being arranged in and above the concave portion, the second inductor element being magnetically coupled with the first inductor element and varying an angle with respect to a horizontal surface of the substrate;

at least one first piezoelectric actuator pair which variably controls the angle of the first inductor element; and at least one second piezoelectric actuator pair which variably controls the angle of the second inductor element.

According to one embodiment of the present invention, a mobile wireless apparatus comprising a variable inductor element, the variable inductor element has:

a substrate;

a first inductor element which is fixedly arranged on the substrate;

a second inductor element which is supported by the substrate, is magnetically coupled with the first inductor element and variably control a mutual conductance with the first inductor element; and at least one piezoelectric actuator pair which torsionally drives the second inductor element.

BRIEF DESCRIPTION OF THE DRAWINGS

FIG. 3 is a section view of FIG. 2 taken along line A-A;

FIG. 4 is a section view of FIG. 2 taken along line B-B;

FIG. 7 is a diagram showing, with arrows, the flow of a current when a positive voltage is applied from the AC power supply 22 to an electrode 16a;

FIG. 13 is a perspective view of a variable inductor element according to a third embodiment;

FIG. 14 is a top view of FIG. 13;

FIG. 19 is a diagram showing the connection relationship between a DC power supply 21 and an AC power supply 22, voltages from which are applied to the variable inductor element according to the fourth embodiment;

FIGS. 20A to 20D are views for explaining the process of manufacturing the variable inductor element according to the fourth embodiment.

DETAILED DESCRIPTION OF THE INVENTION

Figure 1:
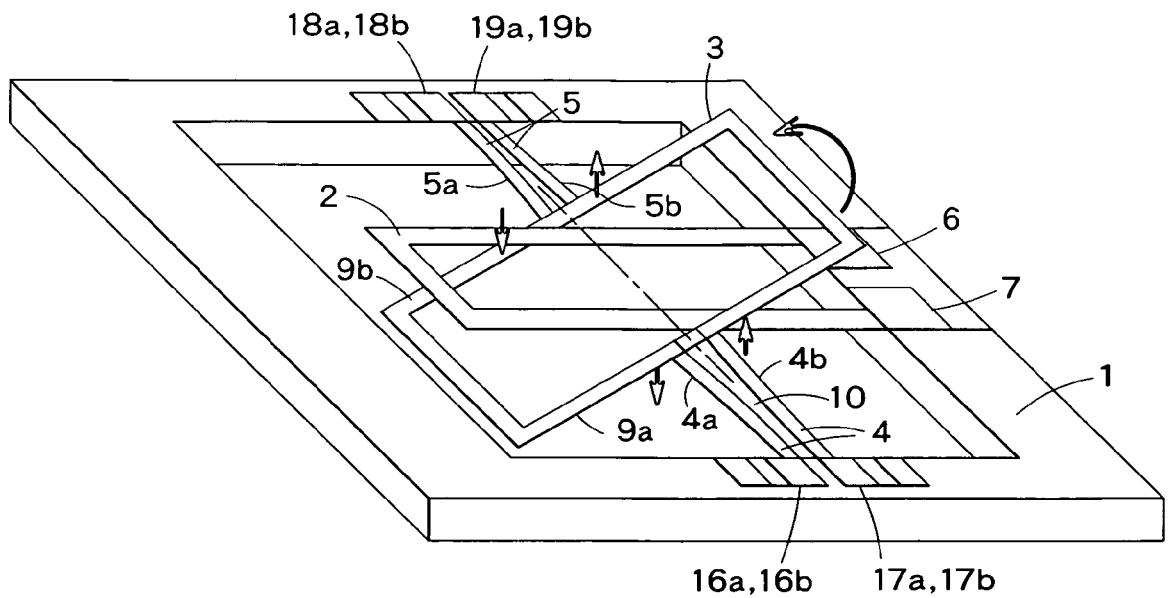
FIG. 1 is a perspective view of a variable inductor element according to a first embodiment of the present invention.

Embodiments of the present invention will be explained below with reference to the drawings. In the accompanying drawings, the same or similar components are denoted by the same or similar reference numerals. Note that each drawing is schematic and that the relationship between a thickness and a two-dimensional size, the ratio between the thicknesses of layers, and the like are different from actual ones. Accordingly, a specific thickness or specific dimensions must be determined in consideration of the following explanation. It goes without saying that all the drawings include respective portions which are different in the dimensional relationship or ratio between components.

FIRST EMBODIMENT

Figure 2:
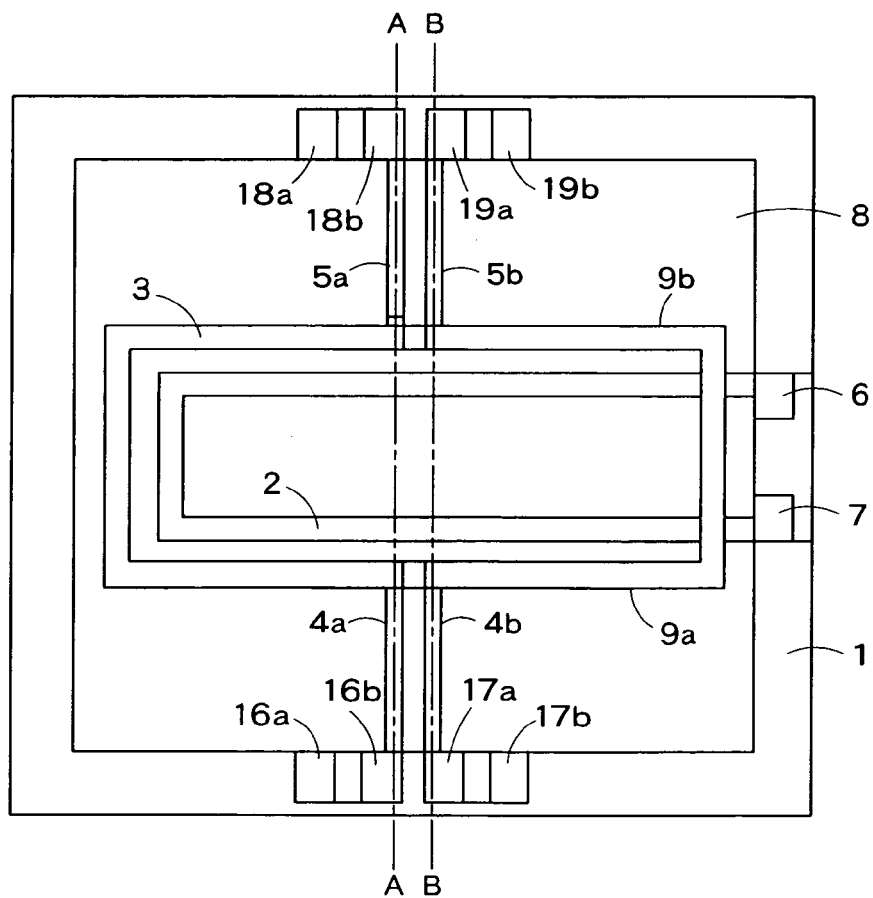
FIG. 2 is a top view of FIG. 1.

FIG. 1 is a perspective view of a variable inductor element according to a first embodiment of the present invention. FIG. 2 is a top view of FIG. 1. FIG. 3 is a section view of FIG. 2 taken along line A-A. FIG. 4 is a section view of FIG. 2 taken along line B-B. The variable inductor element according to this embodiment includes a first inductor element 2 fixed to a substrate 1, a second inductor element 3 which is magnetically coupled to the first inductor element 2 and can variably change an angle with respect to the surface, and two piezoelectric actuator pairs (4a, 4b) and (5a, 5b) which torsionally drive the second inductor element 3.

Both ends of the first inductor element 2 are fixed to the electrodes 6 and 7 on the substrate 1, and the first inductor element 2 has a loop region which generates a magnetic flux. The loop region is arranged above a concave portion 8 formed in the substrate 1. The second inductor element 3 has a loop region which is arranged above the concave portion 8 and is arranged to surround a portion of the first inductor element 2, as shown in FIG. 2. Note that the first inductor element 2 may be arranged in the concave portion 8 formed in the substrate 1. In order to arrange the first inductor element 2 in the concave portion 8 formed in the substrate 1, as described above, a portion of the inductor element 2 is curved.

The specific shapes of the first and second inductor elements 2 and 3 are not particularly limited. In order to simplify explanation of this embodiment, it is assumed that the inductor elements 2 and 3 have a rectangle shape, as shown in FIG. 2. One ends of the piezoelectric actuator pair 4a and 4b are connected to one side 9a of two opposite sides of the second inductor element 3. One ends of the other piezoelectric actuator pair 5a and 5b are connected to one side 9b opposite to the side 9a.

A DC voltage is applied to each member of the piezoelectric actuator pair (4a, 4b) and (5a, 5b). With this operation, the piezoelectric actuator is deformationally driven upward or downward (in a direction from the back to front or front to back of the sheet of FIG. 2). With the deformation driving, one 4a of the piezoelectric actuator pair drives the side 9a of the second inductor element 3 downward, and the other 4b drives the side 9a upward.

Similarly, a DC voltage is applied to each member of the other piezoelectric actuator pair 5a and 5b. One 5a of the piezoelectric actuator pair drives the side 9b of the second inductor element 3 downward, and the other 5b drives the side 9b upward.

As described above, in this embodiment, the two piezoelectric actuator pairs (4a, 4b) and (5a, 5b) drive the two opposite sides 9a and 9b, respectively, of the second inductor element 3 upward and downward. Accordingly, even if each piezoelectric actuator has a small driving force, the second inductor element 3 can be quickly rotationally driven.

The first inductor element 2 has a self inductance and a mutual inductance. The second inductor element 3 also has a self inductance and a mutual inductance. The self inductances are unique to the respective inductor elements and do not vary. The mutual inductances vary according to the degree of magnetic coupling between the first inductor element 2 and the second inductor element 3. More specifically, if the angle of the second inductor element 3 with respect to the substrate surface changes, the degree of magnetic coupling changes accordingly, and as a result, the mutual inductances change. If the mutual inductances change, the inductance of the whole variable inductor element according to this embodiment changes.

By changing the voltage level of a DC voltage applied to the two piezoelectric actuator pairs (4a, 4b) and (5a, 5b), the deformation driving amount of each piezoelectric actuator changes, and the rotation amount of the second inductor element 3 changes. Accordingly, it is possible to variably control the inductance of the whole variable inductor element by varying the DC voltage applied to the two piezoelectric actuator pairs (4a, 4b) and (5a, 5b).

As shown in the section views of FIGS. 3 and 4, the first inductor element 2 is arranged to be isolated above the concave portion 8 formed in the substrate 1, and the second inductor element 3 is arranged outside and above the first inductor element 2. Each of the piezoelectric actuators (4a, 4b) and (5a, 5b), which torsionally drive the second inductor element 3, is composed of a support layer 11 which is formed on the substrate 1, a lower electrode 12 which is formed on the support layer 11, a piezoelectric layer 13 which is formed on the lower electrode 12, and an upper electrode 14 which is formed on the piezoelectric layer 13.

A DC voltage is applied to the lower electrode 12, and the upper electrode 14 is grounded. For this reason, a DC voltage is applied to the upper and lower surfaces of the piezoelectric layer 13, and the piezoelectric layer 13 is deformationally driven according to the DC voltage. The specific configuration of each piezoelectric actuator is not particularly limited.

Typically, either a unimorph-structured piezoelectric actuator or a bimorph-structured one is adopted. A bimorph-structured piezoelectric actuator has a structure in which piezoelectric elements are attached to the two sides of a supporting plate made of metal or insulation. In contrast, a unimorph-structured piezoelectric actuator has a structure in which a piezoelectric element is attached to one side of a supporting plate made of metal or insulation. In the following description, a unimorph-structured piezoelectric actuator will be explained as an example.

Figure 5:
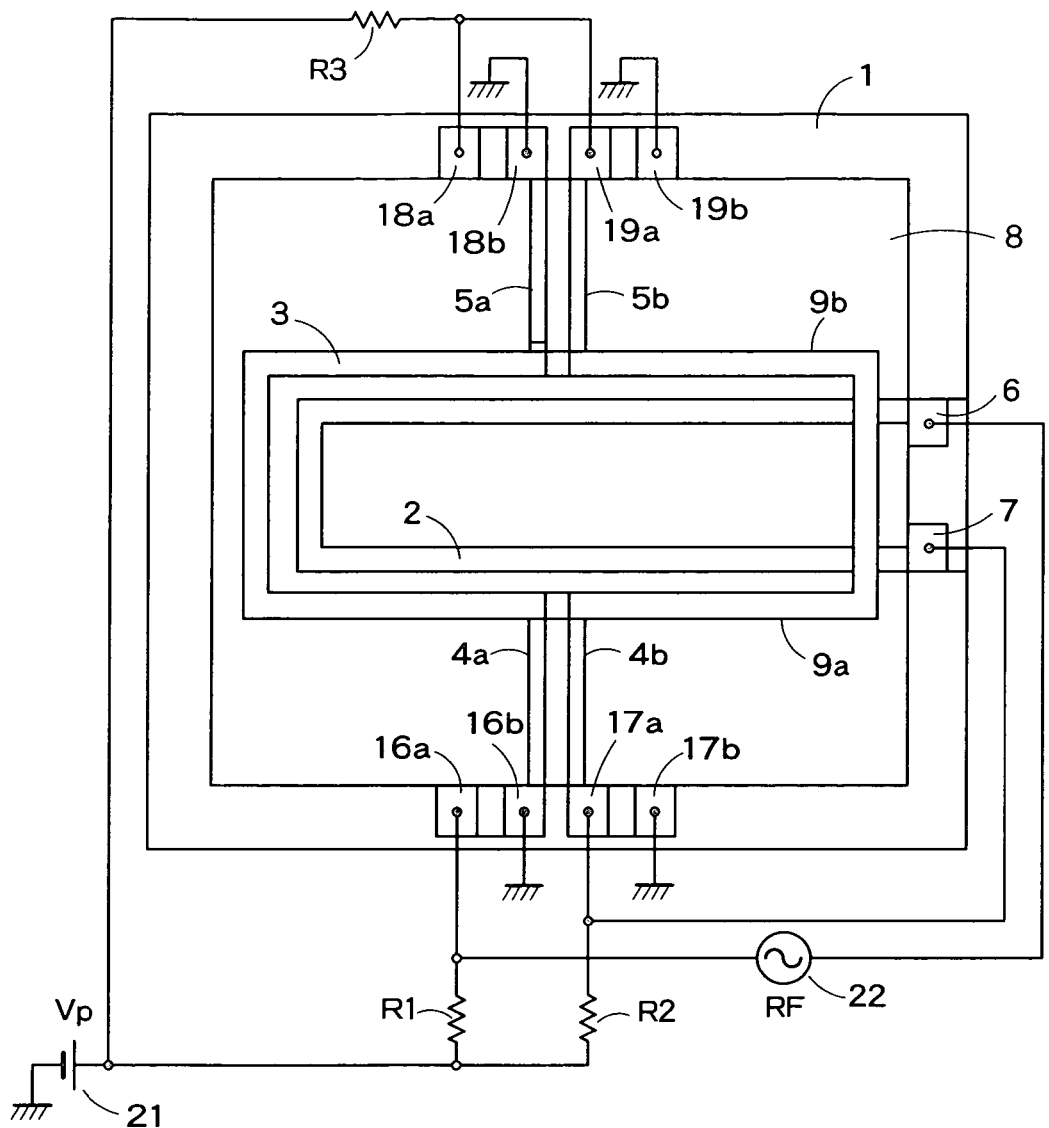
FIG. 5 is a diagram showing the connection relationship between a DC power supply 21 and an AC power supply 22, voltages from which are applied to the variable inductor element according to the first embodiment.
Figure 6:
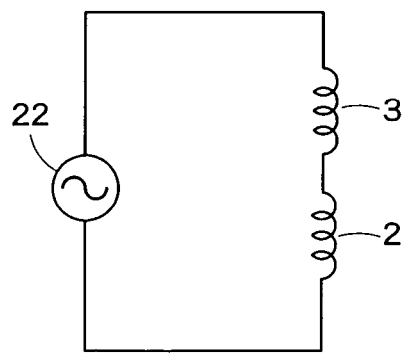
FIG. 6 is an equivalent circuit diagram of the variable inductor element in FIG. 5.

FIG. 5 is a diagram showing the connection relationship between a DC power supply 21 and an AC power supply 22, voltages from which are applied to the variable inductor element according to the first embodiment, and FIG. 6 is an equivalent circuit diagram of the variable inductor element in FIG. 5.

A DC voltage Vp is applied from the common DC power supply 21 between the members of each of electrode pairs (16a, 16b), (17a, 17b), (18a, 18b), and (19a, 19b) of the four piezoelectric actuators constituting the two piezoelectric actuator pairs (4a, 4b) and (5a, 5b). Resistors R1, R2, and R3 which are connected between the DC power supply 21 and the electrodes are intended to cut off an AC voltage from the AC power supply 22.

The electrodes 6 and 7 are provided at the two ends of the first inductor element 2. As shown in FIG. 6, the second inductor element 3 is series-connected to the first inductor element 2, and the AC power supply 22 is connected between the two inductor elements.

FIG. 7 is a diagram showing, with arrows, the flow of a current when an AC voltage is applied from the AC power supply 22 to the electrode 16a. As shown in FIG. 7, a current from the AC power supply 22 flows through the electrode 16a and the lower electrode 12 of the piezoelectric actuator 4a to a left half of the second inductor element 3. The current then flows through the lower electrode 12 of the piezoelectric actuator 5a to the electrode 18a. The current further flows through the electrode 19a and the upper electrode 14 of the piezoelectric actuator 5b to a right half of the second inductor element 3. After that, the current flows through the upper electrode 14 of the piezoelectric actuator 4b to the electrode 17a. The current flows through the electrode 7, first inductor element 2, and electrode 6 finally to the AC power supply 22. If the direction of a voltage from the AC power supply 22 is opposite, a current flows in a direction opposite to the arrows in FIG. 7.

Figure 8A:
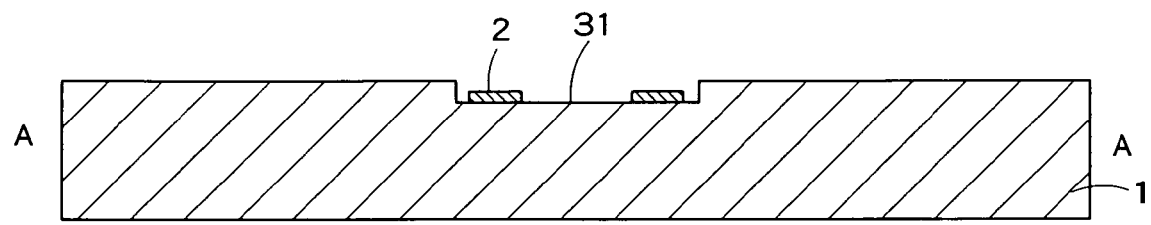
FIGS. 8A to 8C are views showing the process of manufacturing the variable inductor element according to the first embodiment.
Figure 8B:
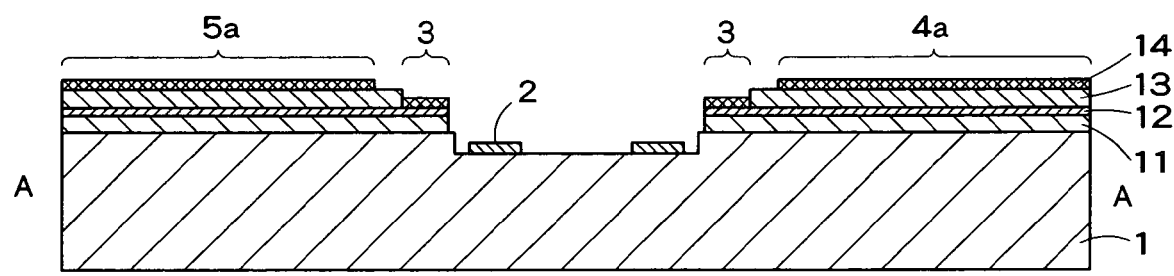
Figure 8C:
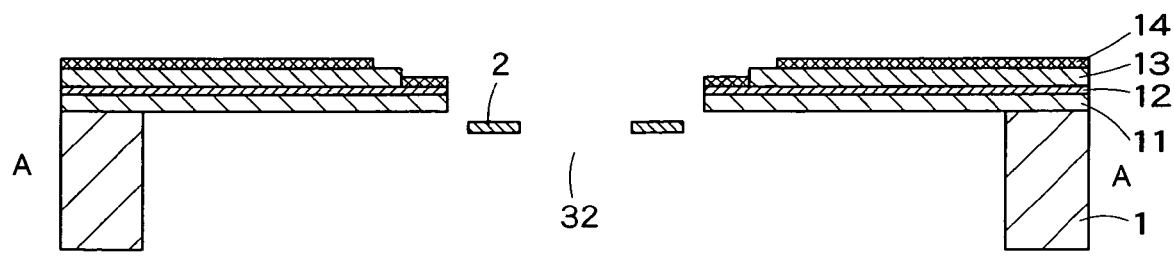

FIGS. 8A to 8C are views showing the process of manufacturing the variable inductor element according to the first embodiment. The manufacturing process of this embodiment will be explained below in order with reference to FIGS. 8A to 8C. A trench 31 having a depth of about 3 µm is first formed in the silicon substrate 1 by known lithography and RIE (Reactive Ion Etching) techniques. An Al film having a thickness of about 2 µm is formed on the bottom surface of the trench 31 by sputtering, and then patterning is performed, thereby forming the first inductor element 2, which is made of Al, at the bottom of the trench 31 (FIG. 8A). Although not shown in FIG. 8A, the first inductor element 2 is connected to the electrodes 6 and 7 on the substrate 1.

The support layer 11, which is made of SiO$_2$, is formed on the silicon substrate 1 except an area where the trench 31 is formed. In this embodiment, the thickness of the support layer 11 was set to about 800 nm.

As shown in FIG. 8B, the lower electrode 12 is formed on the support layer 11 by sputtering. The material for the lower electrode 12 is any of, e.g., aluminum (Al), gold (Au), platinum (Pt), copper (Cu), iridium (Ir), tungsten (W), and molybdenum (Mo). In this embodiment, Al was used as the material for the lower electrode 12.

The piezoelectric layer 13 is formed on each lower electrode 12. The material for the piezoelectric layers 13 is any of, e.g., aluminum nitride (AlN), zinc oxide (ZnO), and a ferroelectric substance having a perovskite structure. In this embodiment, a c-axis oriented AlN film was used as the material for the piezoelectric layers 13. The thickness of the piezoelectric layers 13 is determined in consideration of the amount of displacement and is 10 nm to 1 µm. In this embodiment, the thickness of the piezoelectric layers 13 was set to 500 nm.

The upper electrode 14 is formed on each piezoelectric layer 13. The material for the upper electrodes 14 is the same as that for the lower electrodes 12. The thicknesses of the lower electrodes 12 and upper electrodes 14 are about 100 nm to 5 µm. In this embodiment, the thicknesses of the electrodes were both set to 500 nm.

When forming the lower electrodes 12 and upper electrodes 14, the second inductor element 3 having a two-layer structure, which is composed of the material for the lower electrodes 12 and that for the upper electrodes 14, is formed on the trench 31 side of the upper surface of the support layer 11.

As shown in FIG. 8C, a trench 32 is formed in the back side of the substrate 1 by the lithography and RIE techniques to isolate the first inductor element 2 and second inductor element 3.

With the above-described process, the first inductor element 2, whose outside dimensions are 200 µm×200 µm, and the second inductor element 3, whose outside dimensions are 200 µm×160 µm, are formed.

The variable inductor element obtained by the above-mentioned manufacturing process is sealed using, e.g., another insulating substrate. For example, if a silicon substrate is used as the insulating substrate, a concave portion is formed in the silicon substrate, the variable inductor element is covered and sealed with the insulating substrate such that the second inductor element 3 is contained in the concave portion. This makes it possible to perform packaging with simple operation.

When the inductance of the whole variable inductor manufactured by the manufacturing process was measured while varying the DC voltage Vp applied to the piezoelectric actuators (4a, 4b) and (5a, 5b) of the variable inductor in the range of 0 to 3 V, a variable value ranging from 10.2 to 15.3 nH was obtained. The ratio between the minimum value and the maximum value of the inductance was 1:1.34, and it was found that the variable inductor can have a wide range within which the inductance can vary.

As described above, according to the first embodiment, the first inductor element 2, which is fixed to the substrate 1, and the second inductor element 3, which is magnetically coupled to the first inductor element 2 and can vary the angle with respect to the substrate surface, are provided, and the second inductor element 3 is deformationally driven by the two piezoelectric actuator pairs (4a, 4b) and (5a, 5b). Accordingly, each piezoelectric actuator can rotationally drive the second inductor element 3 with a small driving force. Since the second inductor element 3 is rotationally driven in the concave portion 8 formed in the substrate 1, the substrate surface is in no danger of preventing the rotation driving, and the range within which the angle of the second inductor element 3 can vary can be widened. For this reason, the range within which the inductance of a variable inductor element can vary can be widened, and a variable inductor element excellent in performance can be obtained.

SECOND EMBODIMENT

The shapes of a first inductor element 2 and a second inductor element 3 of a second embodiment are different from those of the first embodiment.

Figure 9:
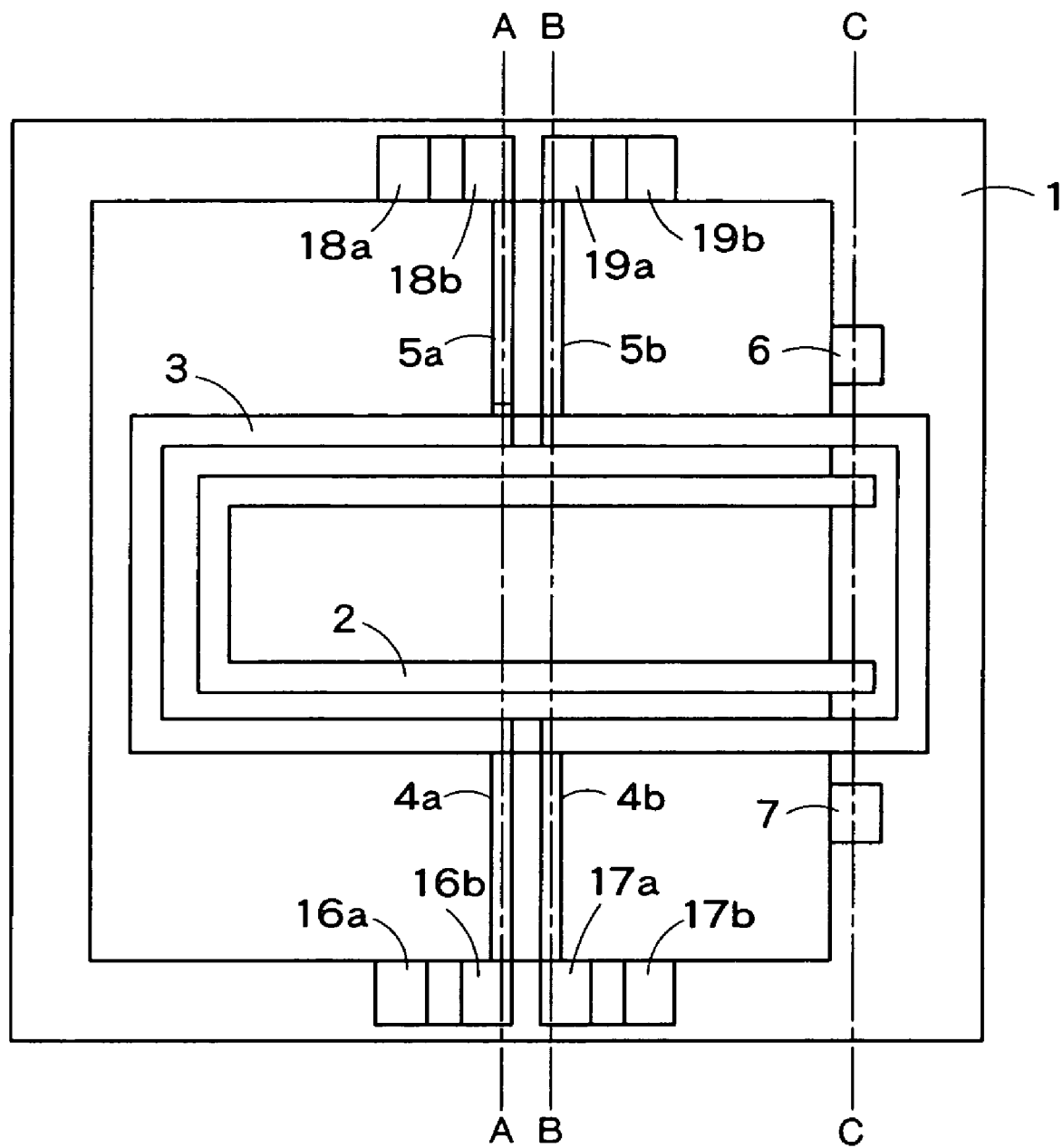
FIG. 9 is a top view of a variable inductor element according to a second embodiment.

FIG. 9 is a top view of a variable inductor element according to the second embodiment. As shown in FIG. 9, the second inductor element 3, whose angle with respect to the surface of a substrate 1 can be varied, is provided to surround the first inductor element 2, which is fixed to the substrate 1.

In the first embodiment, since the second inductor element 3 only partially surrounds the first inductor element 2, some of magnetic fluxes generated by the first inductor element 2 do not pass through the second inductor element 3. In contrast, in the second embodiment, almost all of magnetic fluxes generated by the first inductor element 2 pass through the second inductor element 3. Accordingly, the variable inductor element according to the second embodiment can make the rate of mutual inductance change higher than that of the first embodiment.

Figure 10:
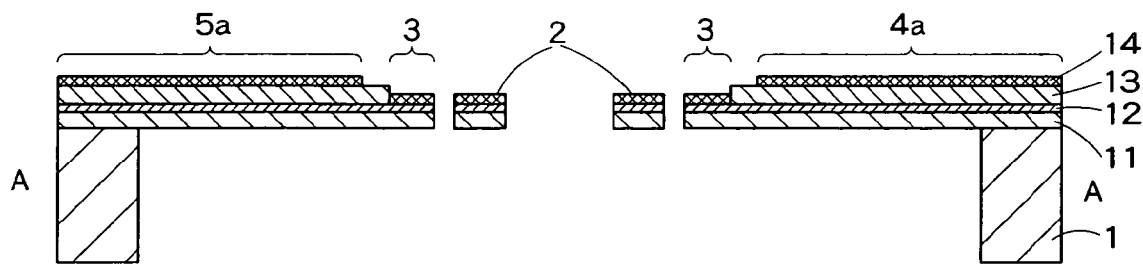
FIG. 10 is a section view of FIG. 9 taken along line A-A.
Figure 11:
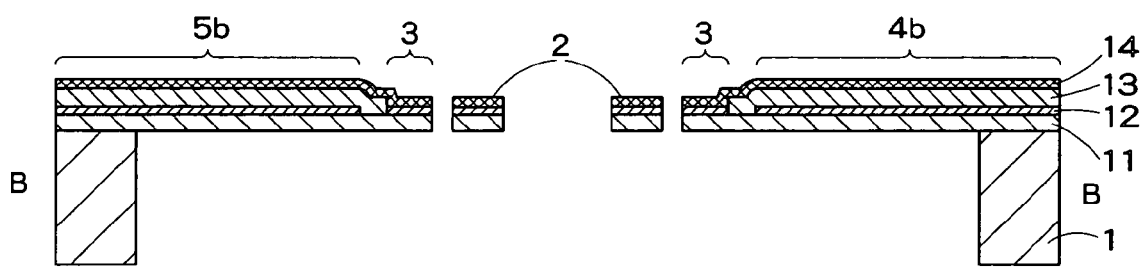
FIG. 11 is a section view of FIG. 9 taken along line B-B.
Figure 12:
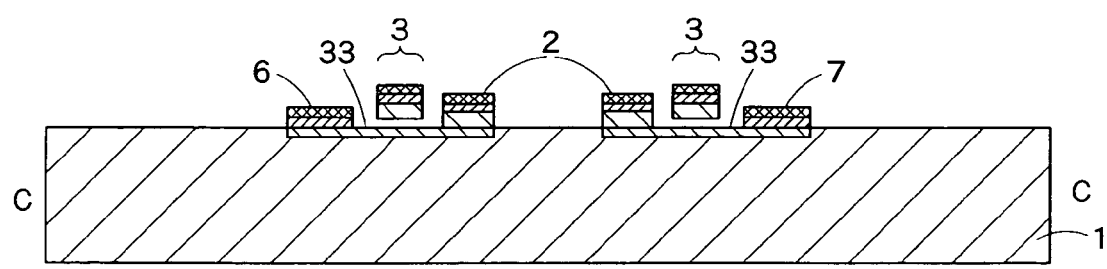
FIG. 12 is a section view of FIG. 9 taken along line C-C.

FIG. 10 is a section view of FIG. 9 taken along line A-A, FIG. 11 is a section view of FIG. 9 taken along line B-B, and FIG. 12 is a section view of FIG. 9 taken along line C-C. As can be seen from FIGS. 10 to 12, the first inductor element 2 and second inductor element 3 are formed at the same height. Accordingly, the inductor elements can be manufactured using the same materials by the same process. This makes it possible to simplify the manufacturing process.

The positions of electrodes 6 and 7 of the first inductor element 2 are different from those of the first embodiment. The electrodes 6 and 7 are provided outside the second inductor element 3 such that the second inductor element 3 are sandwiched between the electrodes 6 and 7. The electrodes 6 and 7 and the first inductor element 2 are electrically continuous with each other via connecting wiring layers 33, as shown in FIG. 12.

In the section taken along line A-A and the section taken along line B-B in FIG. 9, the first inductor element 2 and second inductor element 3 are formed at the same height. On the other hand, in the section taken along line C-C, the second inductor element 3 is formed slightly above the level of the first inductor element 2 and formed to be isolated from the other members. Therefore, the second inductor element 3 is insulated from the connecting wiring layers 33, and the first inductor element 2 and second inductor element 3 are prevented from being short-circuited to each other.

Note that in the section taken along line C-C, to isolate the second inductor element 3, it suffices to form the second inductor element 3 above the connecting wiring layers 33 via a sacrificial layer and then remove the sacrificial layer by dry etching.

The second inductor element 3 is torsionally driven by two piezoelectric actuator pairs (4a, 4b) and (5a, 5b). Even if the second inductor element 3 rotates, it does not interfere with the first inductor element 2. However, since a part of the second inductor element 3 interferes with the substrate surface, the second inductor element 3 can rotate only within the same angle range as that of the first embodiment.

As described above, in the second embodiment, the second inductor element 3 is arranged such that it surrounds the whole of the first inductor element 2. Accordingly, when the second inductor element 3 is rotationally driven, the rate of change in mutual inductance of the two inductor elements becomes higher. Since the first inductor element 2 and second inductor element 3 can be manufactured using the same materials by the same manufacturing process, the process of manufacturing the variable inductor element can be simplified.

THIRD EMBODIMENT

A third embodiment is different from the first and second embodiments in the positions where piezoelectric actuators are attached.

FIG. 13 is a perspective view of a variable inductor element according to the third embodiment, and FIG. 14 is a top view of FIG. 13. The variable inductor element in FIG. 13 includes two piezoelectric actuator pairs (4a, 4b) and (5a, 5b). Each piezoelectric actuator is formed to be L-shaped. More specifically, each piezoelectric actuator has a long side portion 36 which extends in a direction orthogonal to a rotation axis 10 of a second inductor element 3 and has one end connected to an electrode on the substrate 1 and a short side portion 37 which extends in a direction parallel with the rotation axis 10 and has one end connected to the second inductor element 3.

A DC voltage is applied to electrodes 16a, 17a, 18a, and 19a of the piezoelectric actuators (4a, 4b) and (5a, 5b). The long side portion 36 of each piezoelectric actuator is deformationally driven upward or downward depending on the magnitude of the DC voltage. This causes the second inductor element 3 connected to the short side portions 37 to be rotationally driven.

The members of the piezoelectric actuator pair 4a and 4b torsionally drive a side 9a of the second inductor element 3 in opposite directions while the members of the other piezoelectric actuator pair 5a and 5b torsionally drive an opposite side 9b of the second inductor element 3 in opposite directions. Accordingly, even if each piezoelectric actuator has a small driving force, the second inductor element 3 can be rotationally driven.

In the variable inductor element according to the third embodiment, the long side portion 36 of each piezoelectric actuator is arranged in close vicinity to and in parallel with the driving sides of the second inductor element 3. This makes it possible to make the longitudinal length of the variable inductor element in FIG. 14 shorter than that in FIG. 2 and make the size of the variable inductor element smaller than those of the first and second embodiments. On the other hand, since each long side portion 36 which is deformationally driven upward and downward is not directly connected to the second inductor element 3, the range within which the second inductor element 3 can rotate is narrower than those of the first and second embodiments.

FOURTH EMBODIMENT

In each of the first to third embodiments, the first inductor element 2 is fixed on the substrate 1. In a fourth embodiment, not only a second inductor element 3 but also a first inductor element 2 is configured to be capable of varying an angle with respect to the surface of a substrate.

Figure 15:
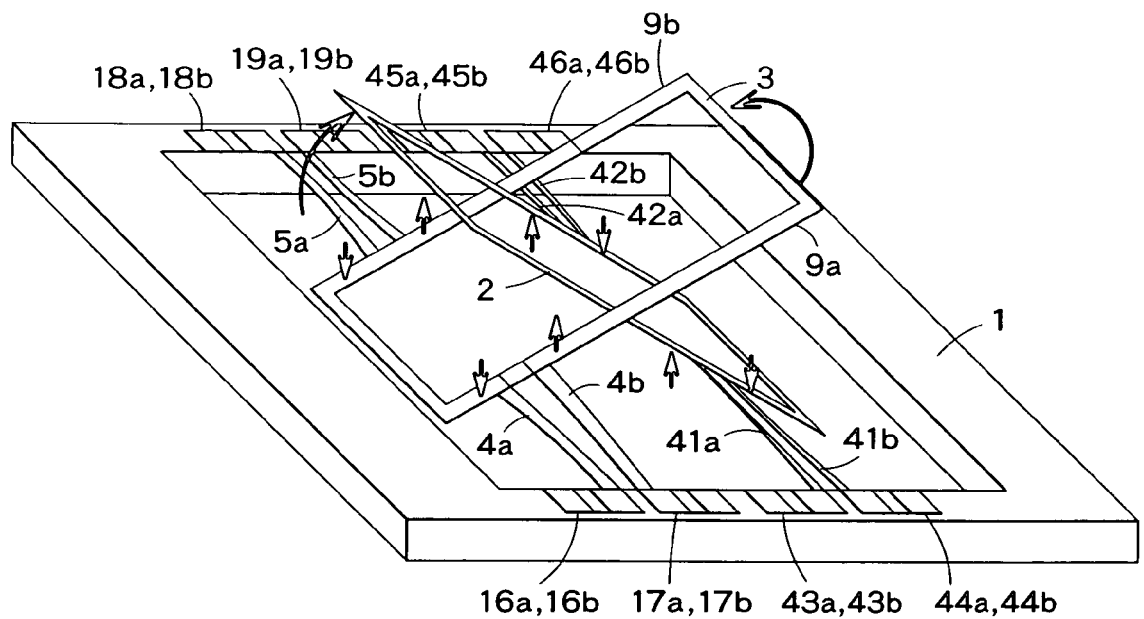
FIG. 15 is a perspective view of a variable inductor element according to a fourth embodiment.
Figure 16:
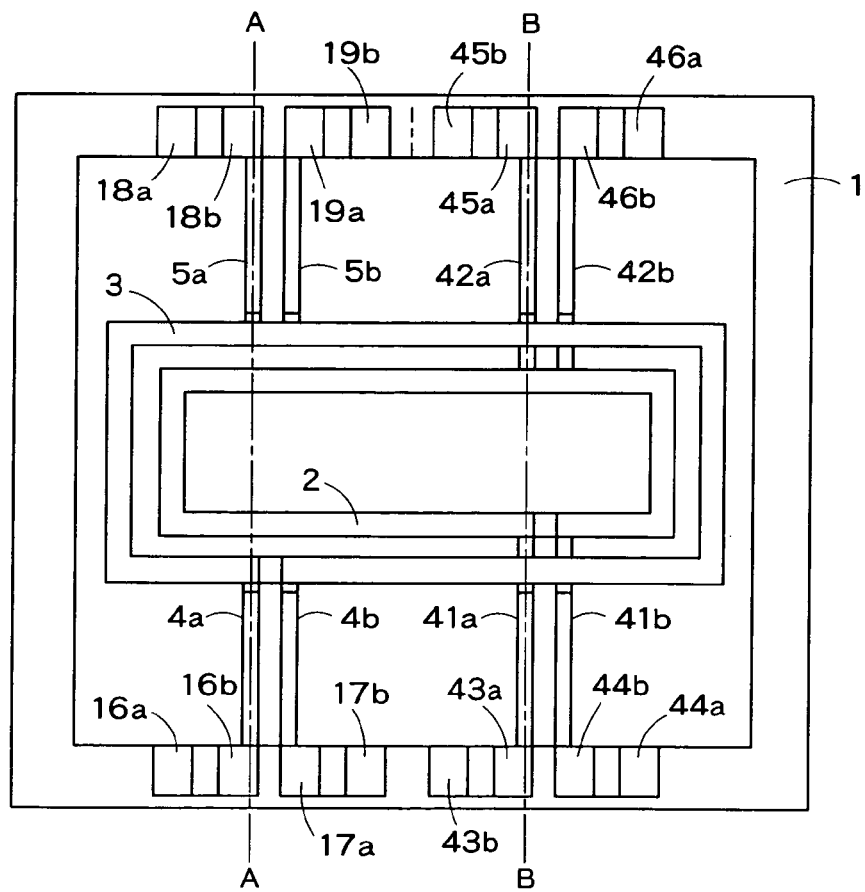
FIG. 16 is a top view of FIG. 15.
Figure 17:
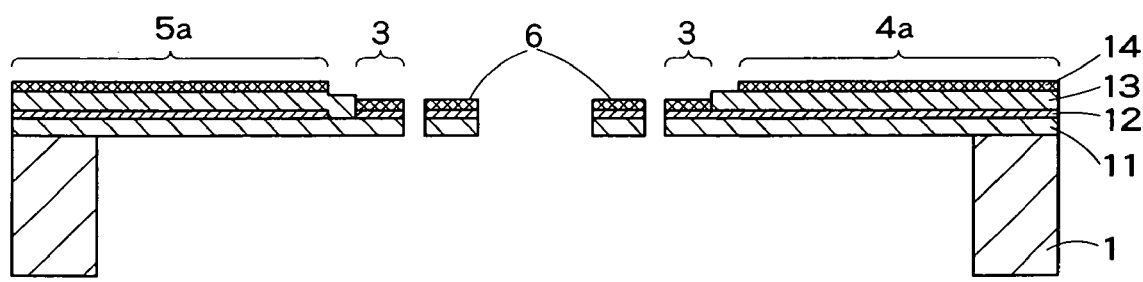
FIG. 17 is a section view of FIG. 16 taken along line A-A.
Figure 18:
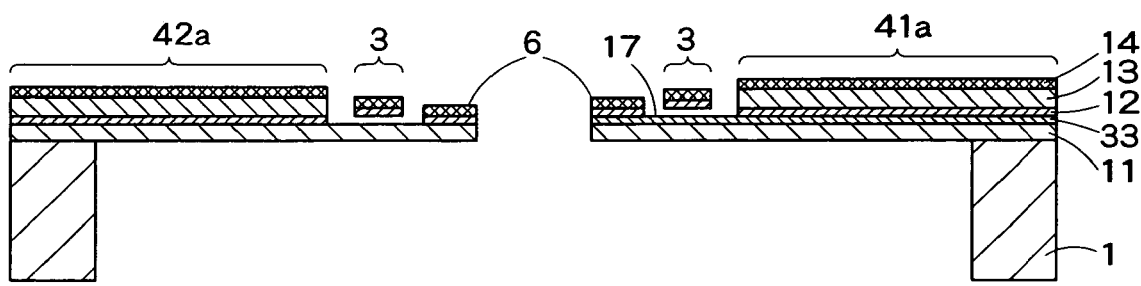
FIG. 18 is a section view of FIG. 16 taken along line B-B.

FIG. 15 is a perspective view of a variable inductor element according to a fourth embodiment, FIG. 16 is a top view of FIG. 15, FIG. 17 is a section view of FIG. 16 taken along line A-A, and FIG. 18 is a section view of FIG. 16 taken along line B-B.

The structure of the second inductor element 3 is the same as those of the first to third embodiments. The second inductor element 3 is rotationally driven by two piezoelectric actuator pairs (4a, 4b) and (5a, 5b). The first inductor element 2 is smaller than the second inductor element 3, and the second inductor element 3 surrounds the first inductor element 2. The first inductor element 2 is configured to be capable of varying the angle with respect to the substrate surface. The first inductor element 2 is supported by two piezoelectric actuator pairs (41a, 41b) and (42a, 42b), similarly to the second inductor element 3. The two piezoelectric actuator pairs (4a, 4b) and (5a, 5b) for the second inductor element 3 are arranged in parallel with the two piezoelectric actuator pairs (41a, 41b) and (42a, 42b) for the first inductor element 2. The piezoelectric actuators have one ends connected to the second inductor element 3 and the other ends connected to electrodes (16a, 16b), (17a, 17b), (18a, 18b) and (19a, 19b). The members of the two piezoelectric actuator pairs (41a, 41b) and (42a, 42b) for the first inductor element 2 have one ends connected to the first inductor element 2 and the other ends connected to electrodes (43a, 43b), (44a, 44b), (45a, 45b) and (46a, 46b).

The electrodes (18a, 18b), (19a, 19b), (16a, 16b), and (17a, 17b) located in a left half of FIG. 16 and the electrodes (46a, 46b), (45a, 45b), (44a, 44b) and (43a, 43b) located in a right half are symmetrically arranged.

The first inductor element 2 is torsionally driven by the two piezoelectric actuator pairs (41a, 41b) and (42a, 42b), and the second inductor element 3 is torsionally driven by the two piezoelectric actuator pairs (4a, 4b) and (5a, 5b). Since both the first inductor element 2 and second inductor element 3 can be rotated, the variable amount of a mutual inductance becomes larger, compared with the case where one of the inductors is fixed. Theoretically, the variable amount of the mutual inductance is twice as large as that of the first embodiment.

As shown in FIG. 17, the first inductor element 2 and second inductor element 3 are formed at the same height using the same materials and can be manufactured by the same manufacturing process. As shown in FIG. 18, in the cross-section taken along line B-B in FIG. 16, the second inductor element 3 is formed more highly than the first inductor element 2. This is because the piezoelectric actuators 41a and 42a for the first inductor element 2 extend below the second inductor element 3 to the first inductor element 2. A connecting wiring layer 33 is provided to conduct the piezoelectric actuators 41a and 42a with the first inductor element 2. Since the second inductor element 3 is arranged above the connecting wiring layer 33 in isolation, there is no likelihood that the second inductor element 3 short-circuits to the connecting wiring layer 33.

FIG. 19 is a diagram showing the connection relationship between a DC power supply 21 and an AC power supply 22, voltages from which are applied to the variable inductor element according to the fourth embodiment. The members of the four piezoelectric actuator pairs, which rotationally drive the first inductor element 2 and second inductor element 3, respectively have the electrodes 16a, 17a, 18a, 19a, 43a, 44a, 45a and 46a, to which a DC voltage is applied, and the electrodes 16b, 17b, 18b, 19b, 43b, 44b, 45b, and 46b, which are grounded. The first inductor element 2 and second inductor element 3 are series-connected to each other, as shown in FIG. 6, and the AC power supply 22 is connected to the ends of the series connection.

FIGS. 20A to 20D are views for explaining the process of manufacturing the variable inductor element according to the fourth embodiment. The views of the process each show the structure of the section of FIG. 16 taken along line B-B. A support layer 11 is first formed on a silicon substrate 1 by plasma CVD, and a part of the support layer 11 is etched. The support layer 11 is, e.g., an $SiO_2$ film having a thickness of 800 nm. The connecting wiring layer 33 is formed on the support layer 11 by sputtering. The connecting wiring layer 33 is, e.g., an Al layer having a thickness of 500 nm. Note that the connecting wiring layer 33 is formed in an area where the corresponding piezoelectric actuators for the first inductor element 2 are formed.

A sacrificial layer 34 is formed above the substrate 1 by sputtering. The sacrificial layer 34 is, e.g., a polysilicon layer having a thickness of 300 nm. The sacrificial layer 34 is provided in an area where the second inductor element 3 is formed.

Lower electrodes 12, piezoelectric layers 13, and upper electrodes 14 are sequentially formed above the substrate 1, thereby manufacturing unimorph-structured piezoelectric actuators. Each of the lower electrodes 12 and upper electrodes 14 is, e.g., an Al layer having a thickness of 300 nm which is formed by sputtering. Each piezoelectric layer 13 is, e.g., a c-axis oriented AlN layer having a thickness of 500 nm. When forming the lower electrodes 12 and upper electrodes 14, the first inductor element 2 and second inductor element 3 are formed using the same materials by the same process.

A trench 32 is formed in the back side of the substrate 1 by known lithography and deep RIE techniques. The sacrificial layer 34 is removed by dry etching using $XeF_2$ as an etching gas, thereby isolating the first inductor element 2 and second inductor element 3.

The outside dimensions of the first inductor element 2 are 300 μm×200 μm, and those of the second inductor element 3 are 220 μm×120 μm.

As described above, according to the fourth embodiment, the two inductor elements, each of which can vary the angle with respect to the substrate surface, are arranged such that they are magnetically coupled. Accordingly, the variable amount of the mutual inductance can be widened twice as large as the case where one of the inductor elements is fixed. This makes it possible to implement a more excellent variable inductor element. Each of the embodiments of the present invention has explained the first inductor element and second inductor element, which are fixed to the substrate having the concave portion therein and arranged in or above the concave portion. The present invention, however, is not limited to this. For example, a configuration may be used in which poles for fixing a first inductor element and a second inductor element are provided on a substrate having no concave portion, and the inductors are bridged between the posts to variably control the second inductor element.

Note that in terms of miniaturization of a variable inductor element, it is more preferable to have a first inductor element and a second inductor element which are fixed to a substrate having a concave portion and arranged in or above the concave portion.

(Mobile Wireless Apparatus)

The variable inductor elements explained above can be preferably used in a high-frequency mobile wireless apparatus such as a cellular phone. For example, FIG. 21 is a block diagram showing the schematic configuration of a cellular phone unit 100 which uses a variable inductor having the same configuration as those of the first to fourth embodiments.

Figure 21:
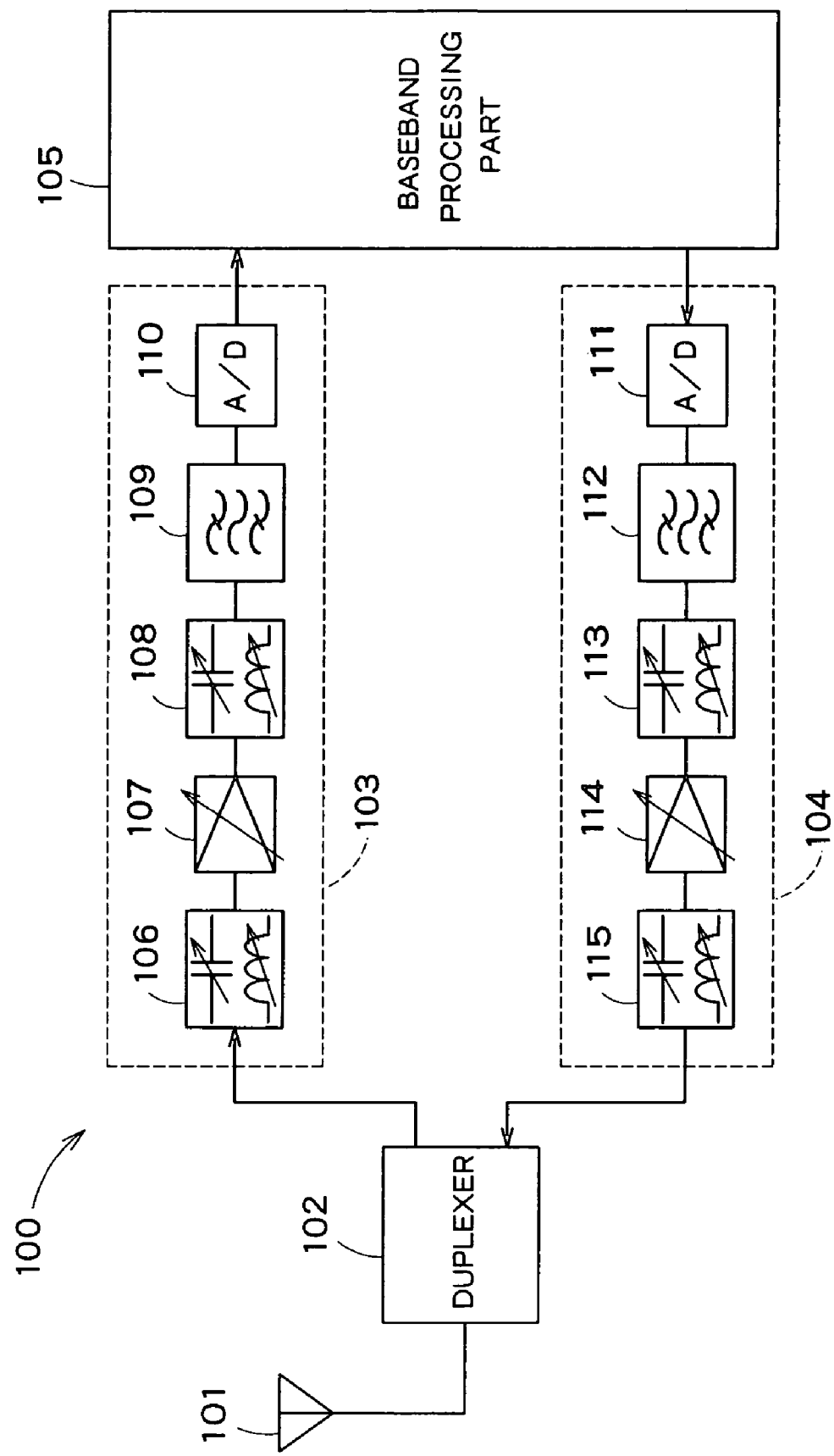
FIG. 21 is a circuit diagram for explaining an example of a mobile wireless apparatus using a variable inductor element pertaining to the present invention.

The cellular phone unit 100 in FIG. 21 includes an antenna 101, a duplexer 102, a receiving part 103, a transmitting part 104, and a baseband processing part 105.

The receiving part 103 includes an LNA (low-noise amplifier) 107, a band-pass filter 109, and an A/D converter 110. The receiving part 103 further includes the above-mentioned variable inductors (impedance matching boxes) 106 and 108 between the duplexer 102 and the LNA (low-noise amplifier) 107 and between the LNA (low-noise amplifier) 107 and the band-pass filter 109 for the purpose of impedance matching.

The transmitting part 104 includes a D/A converter 111 which converts a transmission signal outputted from the baseband processing part 105 into an analog signal, a band-pass filter 112, and a power amplifier 114. The transmitting part 104 further includes variable inductors (impedance matching boxes) 113 and 115 between the band-pass filter 112 and the power amplifier 114 and between the power amplifier 114 and the duplexer 102.

As described above, the use of a variable filter according to this embodiment in a mobile wireless apparatus such as a cellular phone unit makes it possible to provide a mobile wireless apparatus which can quickly variably control an inductance with a small driving force and has a wide range within which the inductance can vary.

What is claimed is:

1. A variable inductor element, comprising:
    a substrate;
    a first inductor element which is fixedly arranged on the substrate;
    a second inductor element which is supported by the substrate, is magnetically coupled with the first inductor element and variably control a mutual conductance with the first inductor element; and
    at least one piezoelectric actuator pair which torsionally drives the second inductor element.

2. The variable inductor element according to claim 1,
    wherein the substrate has a concave portion;
    the first inductor element is arranged in or above the concave portion; and
    at least a portion of the second inductor element is arranged in and above the concave portion, the second inductor element being magnetically coupled with the first inductor element and variably controlling an angle with respect to a horizontal surface of the substrate to variably control a mutual inductance with the first inductance element.

3. The variable inductor element according to claim 1,
    wherein the piezoelectric actuator pair drives the second inductor element upward or downward with respect to the horizontal surface of the substrate.

4. The variable inductor element according to claim 3,
    wherein the second inductor element can be rotated around a rotation axis corresponding to a direction between the piezoelectric actuator pair,
    the piezoelectric actuator pair being arranged on the same side of the second inductor element and at symmetric locations with respect to the rotation axis.

5. The variable inductor element according to claim 4,
    wherein the piezoelectric actuator pair is extended in a direction parallel to the rotation axis from the substrate to the second inductor element.

6. The variable inductor element according to claim 4,
    wherein the piezoelectric actuator has:
    a first member which is extended in a direction orthogonal to the rotation axis and is deformationally driven depending on a DC voltage; and
    a second member, one end of the second member being connected to the first member and being extended in a direction parallel to the rotation axis, and the other end of the second member being connected to the second inductor.

7. The variable inductor element according to claim 1,
    wherein two piezoelectric actuator pairs are provided,
    one and the other of the two piezoelectric actuator pairs being connected to two opposite sides of the second inductor element, respectively,
    the two piezoelectric actuator pairs driving the second inductor element upward or downward with respect to a horizontal surface of the substrate.

8. The variable inductor element according to claim 2,
    wherein the whole second inductor element is arranged in or above the concave portion.

9. The variable inductor element according to claim 1,
    wherein the second inductor element is arranged to surround the whole first inductor element.

10. The variable inductor element according to claim 1, further comprising:
    a connecting wiring layer which connects an electrode of the first inductor element to the first inductor element,
    a portion of the second inductor element being arranged on the substrate,
    the electrode of the first inductor element being provided at a side opposite to the first inductor element by sandwiching the second inductor element on the substrate.

11. The variable inductor element according to claim 1, further comprising:
    a piezoelectric driving electrode which supplies the piezoelectric actuator pair with a driving voltage and supplies the second inductor element with an alternating current.

12. A variable inductor element, comprising:
    a substrate on which a concave portion is formed;
    a first inductor element, at least a portion of the first inductor element being capable of being arranged in and above the concave portion, the first inductor element variably changing an angle with respect to a horizontal surface of the substrate;
    a second inductor element, at least a portion of the second inductor element being arranged in and above the concave portion, the second inductor element being magnetically coupled with the first inductor element and varying an angle with respect to a horizontal surface of the substrate;
    at least one first piezoelectric actuator pair which variably controls the angle of the first inductor element; and
    at least one second piezoelectric actuator pair which variably controls the angle of the second inductor element.

13. The variable inductor element according to claim 12,
    wherein the first piezoelectric actuator pair drives the first inductor element upward or downward with respect to the horizontal surface of the substrate; and
    the second piezoelectric actuator drives the second inductor element upward or downward with respect to the horizontal surface of the substrate.

14. The variable inductor element according to claim 13,
    wherein the first inductor element is rotatable around a first rotation axis at a predetermined angle range,
    the first piezoelectric actuator pair being arranged on the same side of the first inductor element and at symmetric locations with respect to the rotation axis,
    the second inductor element being rotatable around a second rotation axis at predetermined angle range,
    the second piezoelectric actuator pair being arranged on the same side of the second inductor element and at symmetric locations with respect to the rotation axis.

15. The variable inductor element according to claim 1,
    wherein a piezoelectric layer used for the piezoelectric actuator includes nitride aluminum, zinc oxide or ferroelectric substance having a perovskite structure.

16. The variable inductor element according to claim 1, wherein an electrode used for the piezoelectric actuator includes aluminum, gold, platinum, copper, iridium, tungsten, and molybdenum.

17. The variable inductor element according to claim 12, further comprising:
a first piezoelectric driving electrode which supplies the first piezoelectric actuator pair with a driving voltage and supplies the first inductor element with an alternating current; and
a second piezoelectric driving electrode which supplies the second piezoelectric actuator pair with a driving voltage and supplies the second inductor element with an alternating current.

18. A mobile wireless apparatus comprising a variable inductor element,
the variable inductor element has:
a substrate;
a first inductor element which is fixedly arranged on the substrate;
a second inductor element which is supported by the substrate, is magnetically coupled with the first inductor element and variably control a mutual conductance with the first inductor element; and
at least one piezoelectric actuator pair which torsionally drives the second inductor element.

* * * * *